(12) United States Patent
Yokobayashi et al.

(10) Patent No.: US 11,933,489 B2
(45) Date of Patent: Mar. 19, 2024

(54) OPTICAL DEVICE, AND METHOD OF FABRICATING OPTICAL DEVICE

(71) Applicant: STANLEY ELECTRIC CO., LTD., Tokyo (JP)

(72) Inventors: Yusuke Yokobayashi, Tokyo (JP); Yasuyuki Kawakami, Tokyo (JP); Yosuke Maemura, Tokyo (JP); Hideaki Yamamoto, Tokyo (JP); Keijiro Takashima, Tokyo (JP); Ryosuke Kamakura, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/797,885

(22) PCT Filed: Feb. 5, 2021

(86) PCT No.: PCT/JP2021/004468
§ 371 (c)(1),
(2) Date: Aug. 5, 2022

(87) PCT Pub. No.: WO2021/157738
PCT Pub. Date: Aug. 12, 2021

(65) Prior Publication Data
US 2023/0080194 A1 Mar. 16, 2023

(30) Foreign Application Priority Data
Feb. 7, 2020 (JP) .................... 2020-019833

(51) Int. Cl.
*F21V 7/30* (2018.01)
*F21K 9/64* (2016.01)
(Continued)

(52) U.S. Cl.
CPC ............... *F21V 7/30* (2018.02); *F21K 9/64* (2016.08); *F21V 9/35* (2018.02); *H01S 5/0239* (2021.01); *F21Y 2115/30* (2016.08)

(58) Field of Classification Search
CPC ..... F21V 7/30; F21V 7/28; F21V 9/35; F21V 9/32; F21K 9/64; H01S 5/0239;
(Continued)

(56) References Cited

U.S. PATENT DOCUMENTS

2012/0228612 A1 9/2012 Seki et al.
2013/0026527 A1 1/2013 Ichikawa
(Continued)

FOREIGN PATENT DOCUMENTS

JP 2012199510 A 10/2012
JP 2013258373 A 12/2013
(Continued)

OTHER PUBLICATIONS

WO 2018180658 A1 machine translation (Year: 2018).*
(Continued)

*Primary Examiner* — Anne M Hines
*Assistant Examiner* — Jose M Diaz
(74) *Attorney, Agent, or Firm* — Holtz, Holtz & Volek PC

(57) ABSTRACT

An optical device includes a metal reflective layer substantially made of a metal material, a first light transmissive layer disposed on the metal reflective layer, an optical multilayer reflective film disposed on the first light transmissive layer and including a plurality of sublayers stacked on each other and having different refractive indexes, and a wavelength converting layer disposed on the optical multilayer reflective film and containing a fluorescent material capable of absorbing incident excitation light and generating fluorescent light having a lower energy. The wavelength converting layer is capable of generating mixed light containing the excitation light and the fluorescent light in response to irradiation with the excitation light.

9 Claims, 6 Drawing Sheets

(51) Int. Cl.
  *F21V 9/35* (2018.01)
  *F21Y 115/30* (2016.01)
  *H01S 5/0239* (2021.01)

(58) Field of Classification Search
  CPC .. H01S 5/0087; F21Y 2115/30; F21S 41/176;
    F21S 41/16; F21S 41/39; F21S 41/321;
    G02B 5/20; G02B 5/08
  See application file for complete search history.

(56) References Cited

U.S. PATENT DOCUMENTS

2016/0077415 A1    3/2016  Motoya et al.
2021/0223672 A1*   7/2021  Yokoo .................. F21V 7/30

FOREIGN PATENT DOCUMENTS

| JP | 2014082401 A | 5/2014 |
| JP | 2016058638 A | 4/2016 |
| JP | 2019006967 A | 1/2019 |
| WO | 2011126000 A1 | 10/2011 |
| WO | 2018180658 A1 | 10/2018 |

OTHER PUBLICATIONS

International Search Report (ISR) (and English translation thereof) dated Apr. 6, 2021, issued in International Application No. PCT/JP2021/004468.

Written Opinion dated Apr. 6, 2021, issued in International Application No. PCT/JP2021/004468.

* cited by examiner

OPTICAL DEVICE, AND METHOD OF FABRICATING OPTICAL DEVICE

TECHNICAL FIELD

The present disclosure relates to an optical device, in particular, an optical device including a fluorescent member emitting fluorescent light in response to excitation light.

BACKGROUND ART

Unexamined Japanese Patent Application Publication No. 2014-082401 discloses a light source device, in which a laser diode emits excitation light to a wavelength converting member containing a phosphor. The surface of the wavelength converting member to receive excitation light has a periodic structure and can thus prevent the excitation light from being scattered in rearward directions.

Unexamined Japanese Patent Application Publication No. 2019-006967 discloses a phosphor layer (wavelength converting member) having a high thermal conductivity. This phosphor layer is fabricated by sintering inorganic phosphor particles, such as YAG:Ce (yttrium, aluminum, or garnet provided with cerium) particles, and transparent inorganic fine particles, such as alumina particles, at a high concentration.

International Publication No. WO 2011/126000 discloses a method of activating the bonding surfaces of a light-emitting element and a wavelength converting member by sputter etching with an ion beam or plasma, and thus directly fixing the bonding surfaces to each other by surface activation.

SUMMARY OF INVENTION

A main aspect of the present disclosure provides an optical device including: a metal reflective layer containing a metal material; a first light transmissive layer disposed on the metal reflective layer; an optical multilayer reflective film disposed on the first light transmissive layer and including a plurality of sublayers stacked on each other and having different refractive indexes; and a wavelength converting layer disposed on the optical multilayer reflective film and containing a fluorescent material.

DESCRIPTION OF EMBODIMENTS

Figure 1:
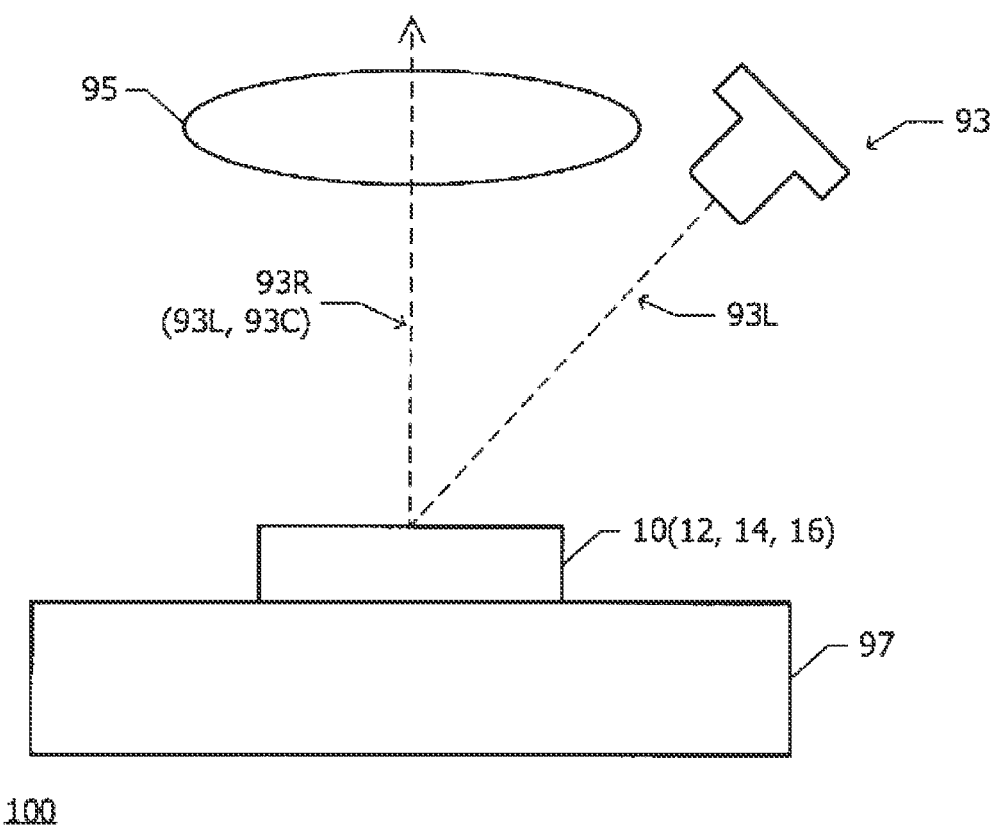
FIG. 1 is a side view illustrating a structure of a lighting apparatus including a laser source.

FIG. 1 is a schematic diagram illustrating an exemplary configuration of a lighting apparatus including a laser source. This type of lighting apparatus is applied to headlights of vehicles, projectors, and light emitters, for example.

A lighting apparatus 100 includes a laser source 93 to emit laser light 93L, a wavelength converting element 10 to reflect and absorb the laser light 93L and emit fluorescent light 93C having a wavelength different from that of the laser light, and an optical unit 95 including components, such as a projection lens to project an enlarged image of synthetic light 93R formed by synthesizing the laser light 93L and the fluorescent light 93C onto a vertical image plane.

A typical example of the laser source 93 is a semiconductor laser diode, such as GaN or InGaN laser diode, which emits blue light having a light intensity of at least 1 W. The number of laser source is not necessarily one and may also be two or more.

The wavelength converting element 10 includes a fluorescent member to absorb blue light and emit yellow light, for example. The wavelength converting element 10 reflects the blue light 93L and emits the yellow light 93C, and thus emits white light 93R as their synthetic light. When the wavelength converting element 10 absorbs the blue light (having an optical energy of hv1) and emits the yellow light (having an optical energy of hv2), the wavelength converting element 10 releases a difference energy (hv1−hv2). The wavelength converting element 10 is thus fixed on a radiating plate 97, such as heat sink, in general.

In some cases, an optical unit, such as condenser lens or collimate lens, may be disposed between the laser source 93 and the wavelength converting element 10. Alternatively, a component, such as optical fiber, may be provided to deliver the laser light 93L emitted from the laser source 93 to the wavelength converting element 10.

Figure 2A:
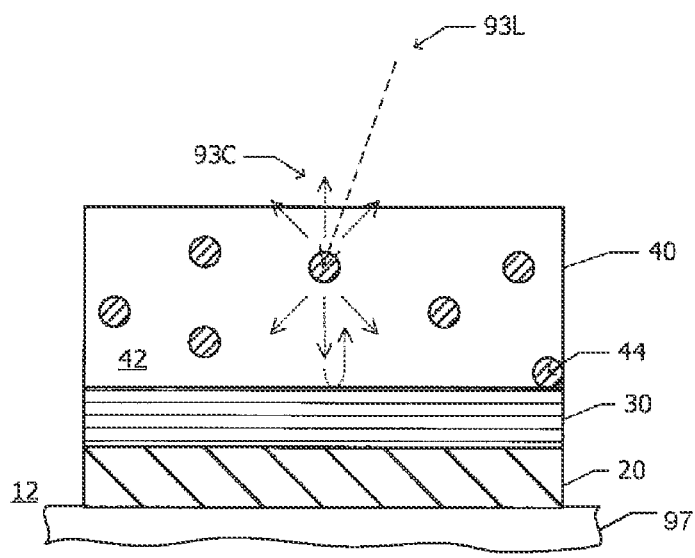
FIG. 2A is a sectional view of a wavelength converting element according to a reference example.

FIG. 2A illustrates a wavelength converting element 12 according to an existing example. The wavelength converting element 12 according to the existing example has a structure in which a metal reflective layer 20 made of a metal material, such as silver, an optical multilayer reflective film 30, such as distributed Bragg reflector (DBR), and a wavelength converting layer 40 are stacked on the radiating plate 97.

A typical example of the optical multilayer reflective film 30 is a DBR layer to reflect light having a specific wavelength, such as blue light or yellow light. The DBR layer has a structure formed by alternately stacking low refractive-index sublayers having a relatively low refractive index and high refractive-index sublayers having a relatively high refractive index in a periodic manner. The low refractive-index sublayers contain $SiO_2$, $MgF_2$, LiF, or $LaF_3$, and the high refractive-index sublayers contain $Nb_2O_5$, $TiO_2$, $Ta_2O_3$, $Al_2O_3$, $HfO_2$, or $Y_2O_3$, for example. The optical multilayer reflective film 30 may also be a dichroic mirror or a short-pass filter (SPF) including a plurality of sublayers stacked on each other and having different refractive indexes, other than the DBR layer.

The wavelength converting layer 40 contains a base material 42 made of transparent inorganic fine particles, such as alumina particles, and inorganic phosphor particles (light emitting material) 44, such as YAG:Ce particles, distributed in the base material 42, for example. The phosphor particles 44 absorb blue light 93L and emit yellow light 93C, for example. This configuration, in which the phosphor particles 44 are covered with the highly thermally conductive inorganic material 42, such as alumina, can efficiently diffuse the heat generated in accordance with light absorption at the phosphor particles 44 and transfer the heat to other components, such as the radiating plate 97.

Figure 2B:
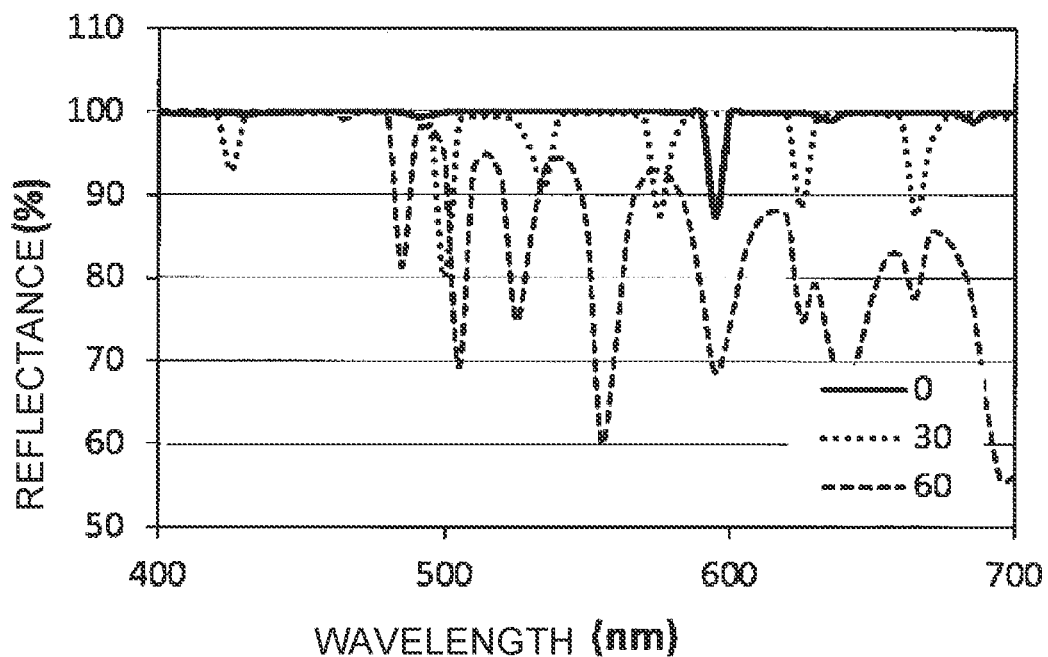
FIG. 2B is a graph illustrating a wavelength distribution (spectrum) of a light reflectance of a layered product including a metal reflective layer and an optical multilayer reflective film, which are included in the wavelength converting element according to the reference example.

FIG. 2B illustrates wavelength dependency of a reflectance of the layered product including the metal reflective layer 20 and the optical multilayer reflective film 30. The vertical axis of the graph indicates a wavelength, and the horizontal axis indicates a reflectance. In this graph, the solid line represents a reflection spectrum when light is incident vertically (that is, at an incident angle of 0°) to the surface of the layered product (adjacent to the optical multilayer reflective film 30), the dotted line represents a reflection spectrum when light is incident at 30° to the normal line of the surface (at an incident angle of 30°), and the dashed line represents a reflection spectrum when light is incident at 60° to the normal line of the surface (at an incident angle of 60°).

The wavelength dependency of a reflectance of light incident from the wavelength converting layer 40 containing YAG:Ce phosphor into the layered product including the metal reflective layer 20 and the optical multilayer reflective film 30 was calculated using a program (Essential Macleod) for calculating the characteristics of optical thin films A YAG:Ce phosphor was coated with a layer of $SiO_2$ as a low refractive-index material and then a layer of $Nb_2O_5$ as a high refractive-index material, and alternately provided with these two layers so as to have 47 layers in total, of which the outermost layer was $SiO_2$. Each of the layers was adjusted such that the optical film thickness was equal to the one-fourth of the central wavelength, four pairs of layers (eight layers) had the identical central wavelength, and the central wavelength was varied from 805 to 380 nm by 85 nm, so as to achieve a high reflectance in the visible light range (the outermost pairs lacked one layer by intention). The resulting layered body was then coated with a 200-nm aluminum layer. The YAG:Ce phosphor was adjusted to have a refractive index of 1.83. The refractive indexes and extinction coefficients of $SiO_2$ and $Nb_2O_5$ were each obtained by measuring a reflectance of a thin film having a thickness of approximately 100 nm deposited on a silicon wafer in an ion assisted deposition system, and then acquiring a result of calculation using the Forouhi-Bloomer model on the basis of the result of measurement. For example, the refractive indexes of $SiO_2$ and $Nb_2O_5$ at 805 nm were 1.47 and 2.31, respectively, and the extinction coefficients were both 0.

The graph shows that, when light is incident at an incident angle of 0°, the reflectance is maintained at a high level in the entire visible light range except for small drops in some wavelength ranges. In contrast, when light is incident at an incident angle of 30° or 60°, the reflectance significantly declines in multiple wavelength ranges.

The above result implies that, in a layered product including a metal reflective layer and an optical multilayer reflective film, the reflectance can be prevented from declining in the case of a small incident angle of incident light but may significantly decline in some wavelength ranges in the case of a large incident angle. This phenomenon is considered to be caused by interference between light reflected by the surface of the optical multilayer reflective film 30 (that is, the interface between the optical multilayer reflective film 30 and the wavelength converting layer 40) or reflected within the optical multilayer reflective film 30, and light reflected by the interface between the optical multilayer reflective film 30 and the metal reflective layer 20.

A large incident angle increases the optical length and is expected to cause interference between light components other than the light of ¼ wavelength providing a high reflectance, resulting in a decrease in the reflectance.

The following description refers back to FIG. 2A.

A part of the light 93L incident to the wavelength converting element 12 is mainly reflected by the optical multilayer reflective film 30 or the metal reflective layer 20 and then emitted through the surface of the wavelength converting layer 40 to the outside. The other part is absorbed by the phosphor particles 44.

The phosphor particles 44 absorbing the light 93L emits light 93C. A part of the light 93C emitted from the phosphor particles 44 is directly emitted through the surface of the wavelength converting layer 40 to the outside. The other part is reflected by the optical multilayer reflective film 30 or the metal reflective layer 20 and then emitted through the surface of the wavelength converting layer 40 to the outside.

As is apparent from the wavelength dependency of a reflectance illustrated in FIG. 2B, when the light 93L and 93C are reflected by the optical multilayer reflective film 30 or the metal reflective layer 20, the light components at small incident angles to the optical multilayer reflective film 30 are efficiently reflected, while the light components at large incident angles are not efficiently reflected, so that the intensity of reflected light decreases in some wavelength ranges. In other words, the ratio (light extraction efficiency) of the intensity of light extracted (reflected) to the outside relative to the intensity of incident light is reduced in terms of the entire wavelength converting element.

The metal reflective layer is often made of silver because of its high reflectance in the visible light range and low wavelength dependency. The silver is, however, susceptible to migration. A metal reflective layer made of silver may impair the long-term reliability of the wavelength converting element due to migration.

In general, the wavelength converting element preferably provides a high light extraction efficiency and high long-term reliability. The present inventors have conducted studies on a wavelength converting element providing both of a high light extraction efficiency and high long-term reliability (that is, capable of preventing migration of silver contained in a metal reflective layer).

Figure 3A:
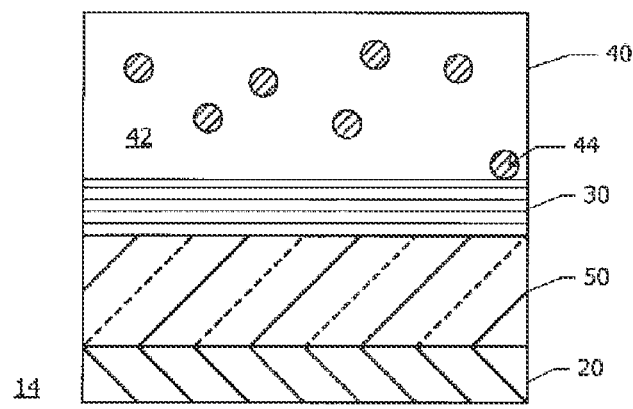
FIG. 3A is a sectional view of a wavelength converting element according to Embodiment 1.

FIG. 3A illustrates a wavelength converting element 14 according to Embodiment 1. The wavelength converting element 14 has a structure including the metal reflective layer 20, a first light transmissive layer 50, the optical multilayer reflective film 30, and the wavelength converting layer 40 stacked on each other. The metal reflective layer 20, the optical multilayer reflective film 30, and the wavelength converting layer 40 are identical to the respective corresponding components of the above-described wavelength converting element 12.

The first light transmissive layer 50 is made of a sapphire substrate having a thickness of 100 μm capable of retaining the layer itself, for example. The sapphire substrate, which accompanies less grain boundaries and less dislocations, applied as the first light transmissive layer 50 can prevent migration of the silver contained in the metal reflective layer 20. This configuration can thus improve the long-term reliability of the wavelength converting element 14.

Figure 3B:
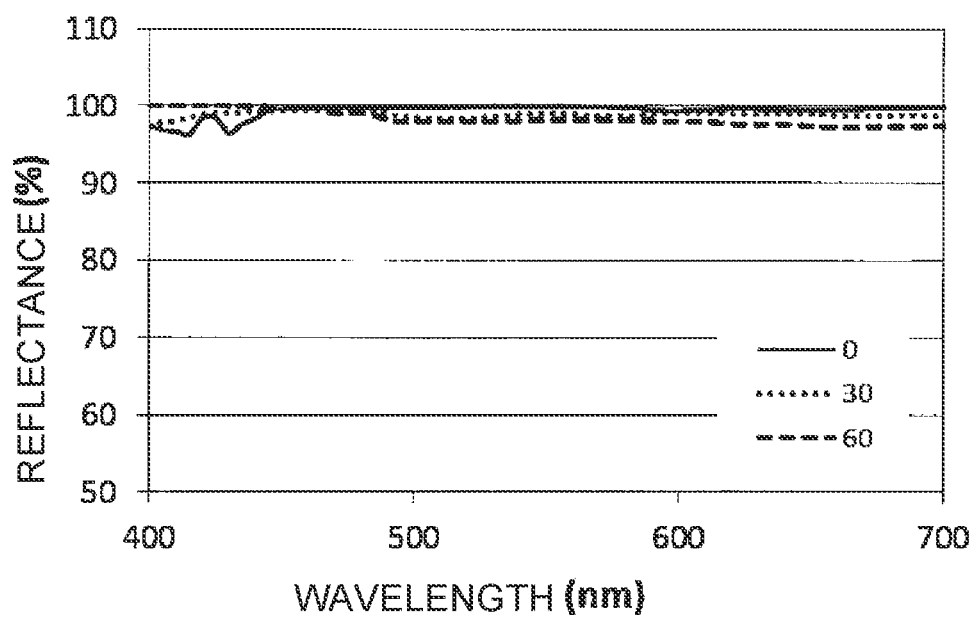
FIG. 3B is a graph illustrating a wavelength distribution (spectrum) of a light reflectance of a layered product including a metal reflective layer, a first light transmissive layer, and an optical multilayer reflective film, which are included in the wavelength converting element according to Embodiment 1.

FIG. 3B illustrates wavelength dependency of a reflectance of a layered product including the metal reflective layer 20, the first light transmissive layer 50, and the optical multilayer reflective film 30. In this graph, the solid line, the dotted line, and the dashed line represent reflection spectra when light is incident at incident angles of 0°, 30°, and 60°, respectively.

The wavelength dependency of a reflectance of light incident from the YAG:Ce phosphor into the layered product including the metal reflective layer and the optical multilayer reflective film was calculated using a program (Essential Macleod) for calculating the characteristics of optical thin films. A YAG:Ce phosphor was coated with a layer of $SiO_2$ as a low refractive-index material and then a layer of $Nb_2O_5$ as a high refractive-index material, and alternately provided with these two layers so as to have 47 layers in total, of which the outermost layer was $SiO_2$. Each of the layers was adjusted such that the optical film thickness (physical film thickness of a refractive index of x) was equal to the one-fourth of the central wavelength, four pairs of layers (eight layers) had the identical central wavelength, and the central wavelength was varied from 805 to 380 nm by 85 nm, so as to achieve a high reflectance in the visible light range (the outermost pairs lacked one layer by intention). The resulting layered product was provided with a sapphire substrate having a no-interference thickness, for example, a thickness of 430 μm on one surface, and provided with a 200-nm aluminum layer on the other surface, so as to form a stacked structure. The wavelength dependency of a reflectance of this structures was then calculated.

The graph shows that the reflectance is maintained at a high level in the entire visible light range regardless of the incident angle. In contrast to the graph illustrated in FIG. 2B, the reflectance drops in the case of a large incident angle are improved by the first light transmissive layer 50 disposed between the metal reflective layer 20 and the optical multilayer reflective film 30.

The first light transmissive layer 50 seems to preferably have a thickness of at least the coherence length of the light 93L and 93C. The first light transmissive layer 50 having a thickness of at least 1.5 μm is expected to be able to prevent interference of light in the entire visible light range.

The coherence time T of light is represented by the expression below:

$T=\lambda^2/<c\Delta\lambda>$ where λ indicates the central wavelength, and Δλ indicates the half bandwidth. The coherence length lc is obtained by multiplying the coherence time by the speed C of light:

$l\_c=cT=\lambda^2/\Delta\lambda$

The present disclosure is directed to an optical device for the visible light range. The description thus assumes that the central wavelength is 550 nm and the half bandwidth is 100 nm, and the coherence length is accordingly 3 μm. That is, the first light transmissive layer having a thickness of at least 1.5 μm, which is equal to the half of the coherence length, can prevent interference.

The first light transmissive layer 50 preferably has a thickness of at least 100 μm, because this first light transmissive layer 50 can sufficiently prevent interference and also provide a mechanical support (self-retaining capability) for the wavelength converting element 14.

Figure 4:
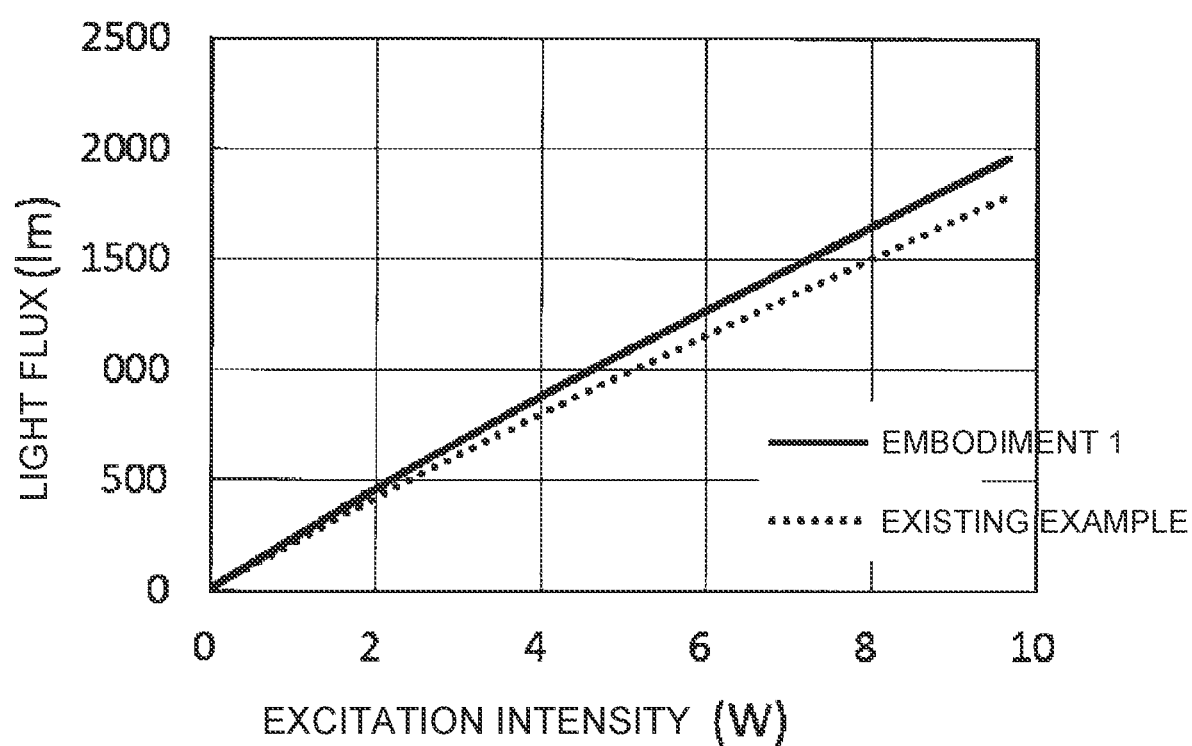
FIG. 4 is a graph illustrating an emitted light flux (light extraction efficiency) in relation to an excitation light intensity in each of the wavelength converting elements according to the reference example and Embodiment 1.

FIG. 4 illustrates a light extraction efficiency of the wavelength converting element 14 according to Embodiment 1 illustrated in FIG. 3B, in comparison to that of the wavelength converting element 12 according to the existing example illustrated in FIG. 2B. In the graph, the vertical axis indicates a light intensity (excitation intensity) of incident excitation light 93L incident to the wavelength converting element, and the horizontal axis indicates a brightness (light flux) of the synthetic light 93R formed by synthesizing the excitation light and the fluorescent light emitted from the wavelength converting element. The light flux represents the light intensity equal to the integral of synthetic light in the visible light range. The dotted line in the graph represents a light flux in the wavelength converting element 12 according to the existing example, and the solid line represents a light flux in the wavelength converting element 14 according to Embodiment 1.

The half bandwidth of light emitted from a laser diode is narrow and is represented in the form of intensity (W) in general. The light flux is calculated by multiplying an intensity-wavelength distribution by a luminosity and integrating the product with respect to the wavelength.

The graph shows that, particularly in the case of a high incident light intensity, the light flux in the wavelength converting element 14 according to Embodiment 1 has a larger inclination from the vertical axis and provides a higher light extraction efficiency, than those of the light flux in the wavelength converting element 12 according to the existing example.

This improvement is considered to be caused by the first light transmissive layer 50, which varies the incident angle of incident light to the optical multilayer reflective film 30 and allows the light components at large incident angles to be efficiently reflected, thereby preventing a decrease in the light intensity of the synthetic light (reflected light).

The light incident from the YAG:Ce phosphor to the layered product corresponds to the light incident to the "optical multilayer reflective film".

Figure 5A:
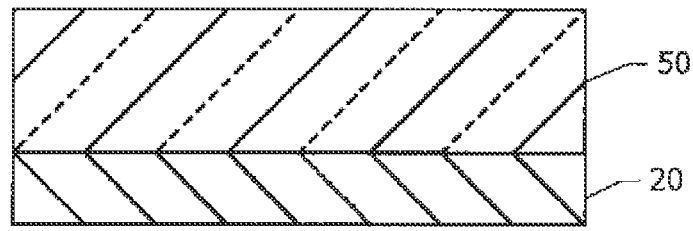
FIGS. 5A to 5C are each a sectional view illustrating a process of fabricating the wavelength converting element according to Embodiment 1.
Figure 5B:
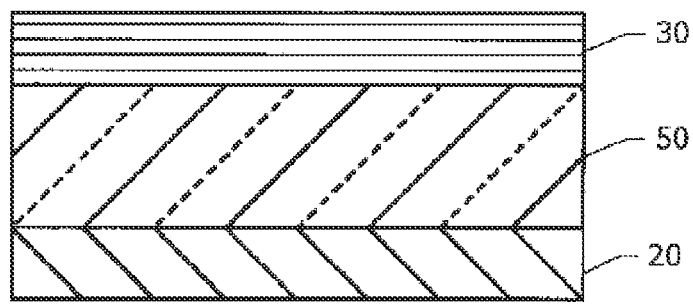
Figure 5C:
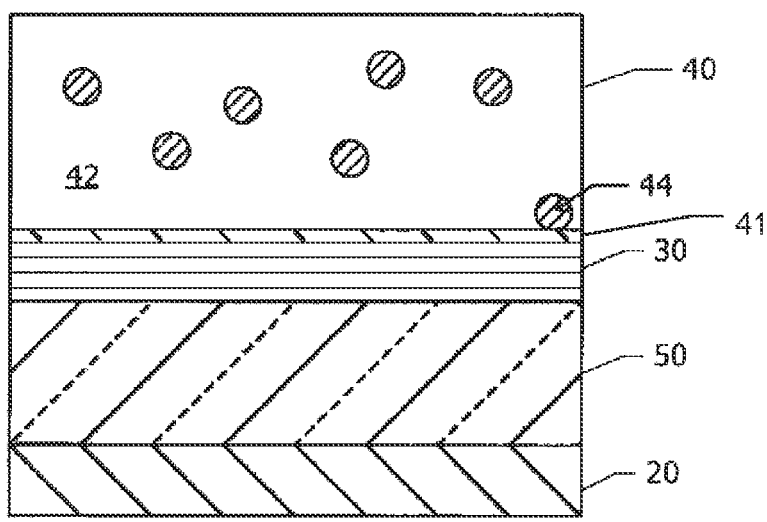

FIGS. 5A to 5C illustrate a process of fabricating the wavelength converting element according to Embodiment 1.

As illustrated in FIG. 5A, a sapphire substrate is prepared as the first light transmissive layer 50. The first light transmissive layer 50 may also be made of a material, such as $SiO_2$, SiC, AlN, GaN, or diamond, having a high light transmittance in the visible light range and high thermal conductivity, other than sapphire. In the case where the metal reflective layer 20 is made of a material, such as silver, susceptible to migration, the first light transmissive layer 50 is preferably a single-crystal substrate (having a low dislocation density), such as $SiO_2$, SiC, AlN, GaN, or diamond substrate, having high cap ability. In terms of physical strength, the first light transmissive layer 50 preferably has a thickness of at least 100 μm.

One surface of the first light transmissive layer 50 (surface adjacent to the bottom of the figure) is coated with a silver film, as the metal reflective layer 20, having a thickness of approximately 200 nm by a procedure, such as electron beam evaporation or sputtering. The metal reflective layer 20 may also be made of a material, such as aluminum, having a high reflectance in the entire visible light range, other than silver.

The first light transmissive layer 50 and the metal reflective layer 20 may be provided with an adhesive layer therebetween to improve adhesion. The adhesive layer may be a Ni or Ti layer having a thickness of approximately several angstroms, for example.

As illustrated in FIG. 5B, the other surface of the first light transmissive layer 50 (surface adjacent to the top of the figure) is coated with a DBR layer as the optical multilayer reflective film 30. The DBR layer may be replaced with a dichroic mirror or short-pass filter including a plurality of sublayers stacked on each other and having different refractive indexes, for example.

The DBR layer is provided by alternately (periodically) stacking low refractive-index sublayers and high refractive-index sublayers by a procedure, such as electron beam evaporation, sputtering, or chemical vapor deposition. The total number of the low refractive-index sublayers and the high refractive-index sublayers is about 10 to 100 layers, and the sublayers each have a thickness of approximately 20 to 100 nm.

The outermost sublayer is preferably made of a material having a refractive index lower than that of YAG:Ce phosphor because this configuration can achieve a smaller film thickness in comparison to the case of the outermost sublayer having a higher refractive index.

The low refractive-index sublayers are made of $SiO_2$, for example. The low refractive-index sublayers may also be made of $MgF_2$, $LiF$, or $LaF_3$, other than $SiO_2$.

The high refractive-index sublayers are made of $Nb_2O_5$, for example. The high refractive-index sublayers may also be made of $TiO_2$, $Ta_2O_3$, $Al_2O_3$, $HfO_2$, or $Y_2O_3$, other than $Nb_2O_5$.

As illustrated in FIG. 5C, the wavelength converting layer 40 is provided on the optical multilayer reflective film 30. The wavelength converting layer 40 is provided by preparing a fluid (green) containing a mixture of alumina fine particles as the base material 42 and YAG:Ce particles as the phosphor particles 44, shaping the fluid into a plate, and then sintering the plate, for example. The optical multilayer reflective film 30 is provided with an optically transparent adhesive layer 41, such as glass adhesive, and then provided with the wavelength converting layer 40 on the adhesive layer 41.

The wavelength converting layer 40 may be any layer provided that the wavelength converting layer 40 contains a light emitting member that emits light having a wavelength different from that of incident light. The wavelength converting layer 40 preferably has a high thermal resistance and a high thermal conductivity.

The above-described process completes the wavelength converting element 14 according to Embodiment 1.

Figure 6:
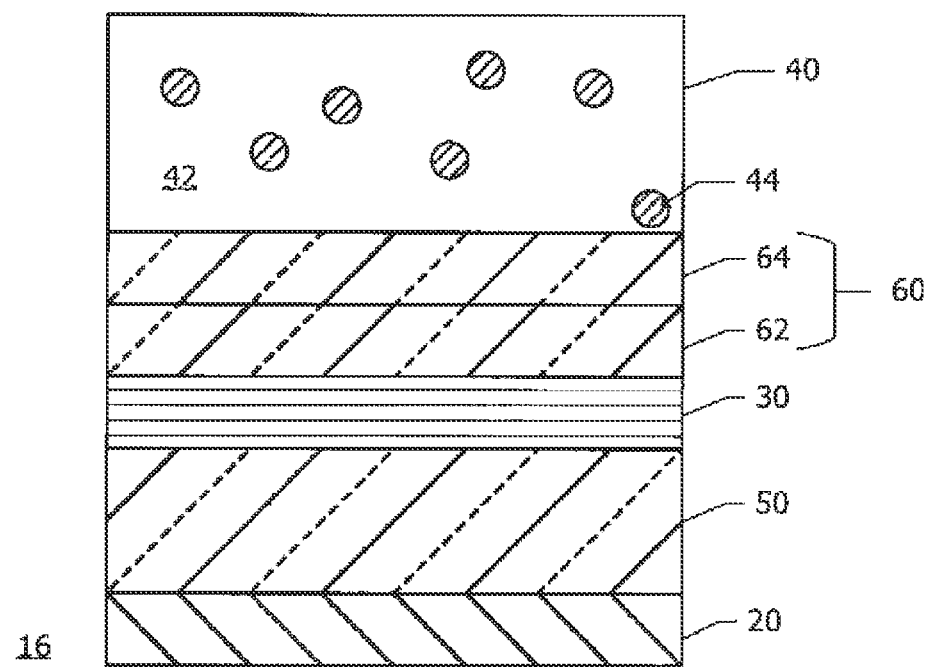
FIG. 6 is a sectional view of a wavelength converting element according to Embodiment 2.

FIG. 6 illustrates a wavelength converting element 16 according to Embodiment 2. The wavelength converting element 16 has a structure including the metal reflective layer 20, the first light transmissive layer 50, the optical multilayer reflective film 30, a second light transmissive layer 60, and the wavelength converting layer 40 stacked on each other. The metal reflective layer 20, the first light transmissive layer 50, the optical multilayer reflective film 30, and the wavelength converting layer 40 have the configurations identical to those of the wavelength converting element 14 according to Embodiment 1.

The second light transmissive layer 60 is made of a material, such as $SiO_2$, having a lower refractive index than that of the wavelength converting layer 40, which is a mixture of alumina and phosphor. Because of the refractive index of the second light transmissive layer 60 lower than the refractive index of the wavelength converting layer 40, light incident to the second light transmissive layer 60 at large incident angles can be totally reflected. This configuration can allow the light components at large incident angles among incident light to be more efficiently reflected, thereby further preventing a decrease in the light intensity of synthetic light (reflected light).

The second light transmissive layer 60 can be fabricated by a process described below, for example. First, a transparent substrate as the first light transmissive layer 50 is prepared. The first light transmissive layer 50 is provided with the metal reflective layer 20 on the lower surface, and provided with the optical multilayer reflective film 30 on the upper surface. Then, a first coupling layer 62 made of $SiO_2$ is formed on the surface of the optical multilayer reflective film 30 by a procedure, such as sputtering. At the same time, the wavelength converting layer 40 is separately prepared. The wavelength converting layer 40 is provided with a second coupling layer 64 made of $SiO_2$ on one surface by a procedure, such as sputtering. The surface of the second coupling layer as it is follows the rough surface of the wavelength converting layer 40 and thus is not flat. The surface of the second coupling layer is flattened by a flattening treatment, such as CMP polishing. That is, the second coupling layer is formed by providing a 300-nm $SiO_2$ layer and then polishing the $SiO_2$ layer into 100 nm, for example.

Then, the first coupling layer 62 and the second coupling layer 64 are bonded to each other at an atomic level by a procedure, such as surface activation, thereby yielding the second light transmissive layer 60 made of the coupling layers 62 and 64. Since the first coupling layer 62 and the second coupling layer 64 are bonded to each other at an atomic level without a material therebetween, such as resin or glass, having a low thermal conductivity, the second light transmissive layer 60 has a low thermal resistance and can effectively transfer heat generated at the wavelength converting layer 40.

Although the foregoing describes some example embodiments, these embodiments are not to be construed as limiting the present disclosure. Persons skilled in the art are expected to readily recognize that various modifications, improvements, and combinations are available.

The invention claimed is:

1. An optical device, comprising:
   a metal reflective layer made of a metal material;
   a first light transmissive layer disposed on the metal reflective layer, wherein the first light transmissive layer has a thickness of at least 1.5 µm;
   an optical multilayer reflective film disposed on the first light transmissive layer and comprising a plurality of sublayers stacked on each other and having different refractive indexes, wherein the optical multilayer reflective film is formed in contact with the first light transmissive layer; and
   a wavelength converting layer disposed on the optical multilayer reflective film and including a fluorescent material capable of absorbing incident excitation light and generating fluorescent light having a lower energy, the wavelength converting layer being capable of generating mixed light including the excitation light and the fluorescent light in response to irradiation with the excitation light,
   wherein the optical device is configured such that part of the fluorescent light generated by the fluorescent material included in the wavelength converting layer is incident to the optical multilayer reflective film, the first light transmissive layer, and the metal reflective layer and is reflected by the optical multilayer reflective film and the metal reflective layer, thereby being emitted through a surface of the wavelength converting layer to outside.

2. The optical device according to claim 1, wherein:
   the first light transmissive layer is a transparent substrate comprising a first surface and a second surface that are parallel to each other, the transparent substrate being capable of retaining the substrate itself,
   the metal reflective layer is disposed on the first surface, and the optical multilayer reflective film is disposed on the second surface.

3. The optical device according to claim 2, wherein the transparent substrate is substantially made of $SiO_2$, SiC, GaN, sapphire, or diamond.

4. The optical device according to claim 2, wherein the metal reflective layer is made of silver.

5. The optical device according to claim 2, further comprising a second light transmissive layer disposed between the optical multilayer reflective film and the wavelength converting layer, the second light transmissive layer being made of $SiO_2$ and having a refractive index lower than a refractive index of the wavelength converting layer.

6. The optical device according to claim 2, further comprising:
    an excitation light source disposed above the second surface and capable of emitting excitation light to the wavelength converting layer; and
    an optical unit disposed in an optical path of the mixed light generated at the wavelength converting layer.

7. The optical device according to claim 6, wherein the excitation light source includes a semiconductor laser.

8. A method of fabricating the optical device according to claim 1, the method comprising:
    providing the metal reflective layer on a rear surface of the first light transmissive layer, the first light transmissive layer having the thickness of at least 1.5 µm;
    providing the optical multilayer reflective film in contact with a front surface of the first light transmissive layer; and
    bonding the wavelength converting layer to an upper surface of the optical multilayer reflective film via an optically transparent adhesive layer.

9. A method of fabricating an optical device having a metal reflective layer substantially made of a metal material, a first light transmissive layer disposed on the metal reflective layer, an optical multilayer reflective film disposed on the first light transmissive layer and comprising a plurality of sublayers stacked on each other and having different refractive indexes, and a wavelength converting layer disposed on the optical multilayer reflective film and including a fluorescent material capable of absorbing incident excitation light and generating fluorescent light having a lower energy, the wavelength converting layer being capable of generating mixed light including the excitation light and the fluorescent light in response to irradiation with the excitation light, wherein the optical device is configured such that part of the fluorescent light generated by the fluorescent material included in the wavelength converting layer is incident to the optical multilayer reflective film and the metal reflective layer and reflected by the optical multilayer reflective film and the metal reflective layer, thereby being emitted through a surface of the wavelength converting layer to outside, the method comprising:
    providing the metal reflective layer on a rear surface of the first light transmissive layer;
    providing the optical multilayer reflective film on a front surface of the first light transmissive layer; and
    bonding the wavelength converting layer to an upper surface of the optical multilayer reflective film via an optically transparent adhesive layer,
    wherein the bonding the wavelength converting layer to the upper surface of the optical multilayer reflective film comprises:
    providing a first coupling layer on the upper surface of the optical multilayer reflective film;
    providing a second coupling layer on a lower surface of the wavelength converting layer;
    flattening a lower surface of the second coupling layer; and
    bonding an upper surface of the first coupling layer and the lower surface of the second coupling layer by surface activation, thereby integrating the first coupling layer and the second coupling layer to yield a second light transmissive layer, and
    wherein the second light transmissive layer has a refractive index lower than a refractive index of the wavelength converting layer.

* * * * *